United States Patent
Guettaf et al.

(10) Patent No.: US 7,032,202 B2
(45) Date of Patent: Apr. 18, 2006

(54) SYSTEM AND METHOD FOR IMPLEMENTING A FLEXIBLE TOP LEVEL SCAN ARCHITECTURE USING A PARTITIONING ALGORITHM TO BALANCE THE SCAN CHAINS

(75) Inventors: Amar Guettaf, Sunnyvale, CA (US); Xiaodong Xie, Fremont, CA (US)

(73) Assignee: Broadcom Corporation, Irvine, CA (US)

( * ) Notice: Subject to any disclaimer, the term of this patent is extended or adjusted under 35 U.S.C. 154(b) by 13 days.

(21) Appl. No.: 10/299,187

(22) Filed: Nov. 19, 2002

(65) Prior Publication Data
US 2004/0098687 A1    May 20, 2004

(51) Int. Cl.
*G06F 17/50* (2006.01)
*G06F 9/45* (2006.01)
*G01R 31/28* (2006.01)

(52) U.S. Cl. ............... 716/7; 716/1; 716/2; 716/12; 714/729

(58) Field of Classification Search ........... 716/1–7, 716/8–18; 714/724–729, 738, 30, 715; 707/14, 707/22

See application file for complete search history.

(56) References Cited

U.S. PATENT DOCUMENTS

| | | | | |
|---|---|---|---|---|
| 5,889,788 A * | 3/1999 | Pressly et al. | ............... | 714/726 |
| 5,949,692 A * | 9/1999 | Beausang et al. | ............. | 716/18 |
| 6,067,651 A * | 5/2000 | Rohrbaugh et al. | ......... | 714/738 |
| 6,128,025 A * | 10/2000 | Bright et al. | ............... | 345/504 |
| 6,185,721 B1 * | 2/2001 | Hosokawa | ...................... | 716/5 |
| 6,256,770 B1 * | 7/2001 | Pierce et al. | .................. | 716/18 |
| 6,434,733 B1 * | 8/2002 | Duggirala et al. | ............ | 716/11 |
| 6,496,966 B1 * | 12/2002 | Barney et al. | ................ | 716/10 |
| 6,587,981 B1 * | 7/2003 | Muradali et al. | ........... | 714/726 |
| 6,631,344 B1 * | 10/2003 | Kapur et al. | .................. | 703/22 |
| 6,681,356 B1 * | 1/2004 | Gerowitz et al. | ........... | 714/729 |
| 6,877,120 B1 * | 4/2005 | Yoshimoto | ................... | 714/726 |
| 6,886,145 B1 * | 4/2005 | Davidson et al. | .............. | 716/6 |
| 2002/0073373 A1 * | 6/2002 | Nakao et al. | ............... | 714/738 |
| 2002/0125907 A1 * | 9/2002 | Kurtulik et al. | ............... | 324/765 |
| 2002/0162037 A1 * | 10/2002 | Woods et al. | ............... | 713/322 |
| 2002/0170009 A1 * | 11/2002 | Barnhart | ...................... | 714/726 |
| 2003/0079165 A1 * | 4/2003 | Ffrench et al. | ............. | 714/726 |
| 2003/0101376 A1 * | 5/2003 | Sanghani | ..................... | 714/30 |
| 2003/0115525 A1 * | 6/2003 | Hill et al. | .................... | 714/726 |
| 2003/0171906 A1 * | 9/2003 | Parulkar et al. | .............. | 703/14 |
| 2003/0182604 A1 * | 9/2003 | Hathaway et al. | .......... | 714/715 |
| 2003/0191996 A1 * | 10/2003 | Mukherjee et al. | ......... | 714/724 |

* cited by examiner

*Primary Examiner*—Vuthe Siek
*Assistant Examiner*—Magid Y. Dimyan
(74) *Attorney, Agent, or Firm*—McAndrews, Held & Malloy, Ltd.

(57) ABSTRACT

A method and system are disclosed for balancing a plurality of flip-flops across a number of global scan chains in a design of a digital integrated circuit chip. The design of the chip is organized into a number of discrete blocks such that each of the discrete blocks comprises a plurality of flip-flops. Within each discrete block, the plurality of flip-flops is connected to form a number of sub-chains of flip-flops. The sub-chains are then connected, within and across the discrete blocks, to generate a number of global scan chains such that the resultant number of flip-flops in each global scan chain is substantially the same.

40 Claims, 5 Drawing Sheets

SYSTEM AND METHOD FOR IMPLEMENTING A FLEXIBLE TOP LEVEL SCAN ARCHITECTURE USING A PARTITIONING ALGORITHM TO BALANCE THE SCAN CHAINS

RELATED APPLICATIONS

[Not Applicable]

FEDERALLY SPONSORED RESEARCH OR DEVELOPMENT

[Not Applicable]

MICROFICHE/COPYRIGHT REFERENCE

[Not Applicable]

BACKGROUND OF THE INVENTION

Digital integrated circuit chips are composed of many millions of gates that make up various functional components on a chip such as flip-flops, multiplexers, logic circuits, etc. A given chip design may have thousands of flip-flops scattered throughout the chip.

In order to effectively and efficiently test a given chip, certain test features are typically incorporated into the chip design for testing purposes. Before a chip is actually taped out and manufactured, the chip design is first simulated in software using various simulation tools such as, for example, a Verilog Test Bench. By simulating the design of the chip, the design features of the chip may be thoroughly tested before the expense and time of actually manufacturing the chip is incurred.

Pattern verification is a critical phase in testing of chips. A scan pattern is a digital string of binary ones and zeros that may be shifted through a scan chain of flip-flops in the chip design. Every scan pattern cycle is composed of two phases. The first phase is the load_unload phase where new data is shifted into the scan chains of flip-flops. The second phase is the capture phase where the data is captured into the flip-flops by applying a clock pulse.

Typically, the flip-flops in a digital integrated circuit design are designed such that they have normal data inputs and outputs (D and Q) and test inputs such as TI (test data input) and TE (test enable input). During simulation, the flip-flops may be placed in the test mode by enabling the TE input. Data may then be clocked into the flip-flops through the TI input instead of the normal D data input. During testing, the flip-flops of the chip are chained together to form multiple scan chains. The output Q of a given flip-flop is connected to the input TI of a next flip-flop. Each scan chain may comprise, typically, 5000 to 10,000 flip-flops.

The length of the load_unload phase is equal to the length of the longest scan chain of flip-flops. In multimillion gate designs, the longest chain may have thousands of flip-flops. Most of the time, simulating the scan patterns through the scan chains is spent shifting the data into and out of the scan chains. No matter what the length of any given scan chain, the load_unload phase is still equal to the length of the longest scan chain of flip-flops. If one scan chain is very short and another scan chain is very long, the longest scan chain drives the time it takes to perform the scan test since the scan chains are typically clocked in parallel.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A method is provided for balancing a plurality of flip-flops across a number of global scan chains in a design of a digital integrated circuit chip. The design of the chip is organized into a number of discrete blocks such that each of the discrete blocks comprises a plurality of flip-flops. Within each discrete block, the plurality of flip-flops is connected to form a number of sub-chains of flip-flops. The sub-chains are then connected, within and across the discrete blocks, to generate a number of global scan chains such that the resultant number of flip-flops in each global scan chain is substantially the same.

A system is provided to simulate a design of a digital integrated circuit chip in order to generate a number of global scan chains of flip-flops within the design of the chip. The system comprises a design simulation tool that inputs a set of initial chip design definition files. The set of initial design definition files are organized as discrete blocks with each discrete block comprising sub-chains of flip-flops. The simulation tool outputs a set of modified chip design definition files after processing the set of initial chip design definition files such that the modified chip design definition files comprise the number of global scan chains. The scan chains are formed by linking the sub-chains of flip-flops within and across the discrete blocks.

These and other advantages and novel features of the present invention, as well as details of an illustrated embodiment thereof, will be more fully understood from the following description and drawings.

DETAILED DESCRIPTION OF THE INVENTION

Aspects of the present invention provide a system and method to balance a plurality of flip-flops across a desired number of global scan chains in a design of a digital integrated circuit chip.

Figure 1:
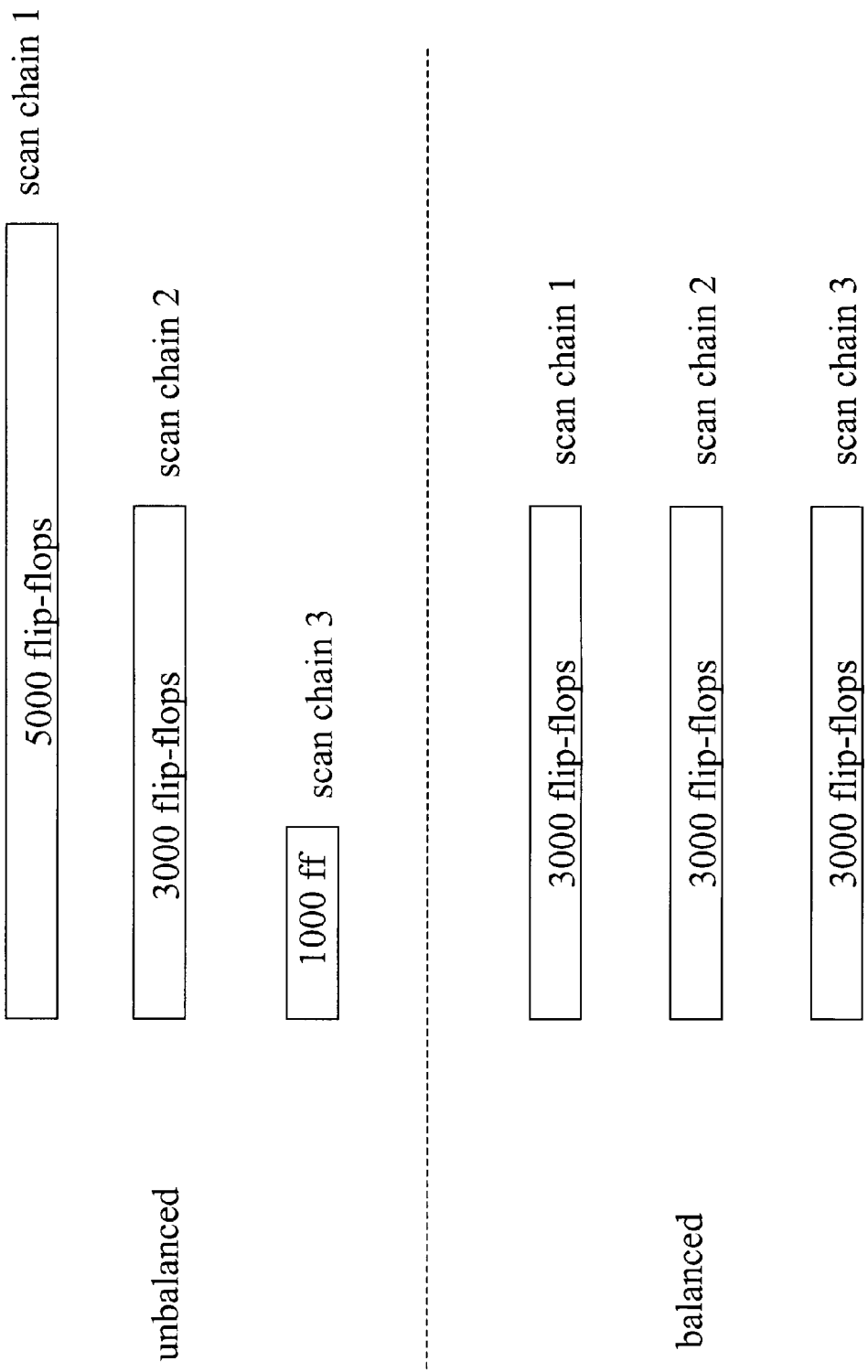
FIG. 1 is a schematic diagram of an exemplary unbalanced set of scan chains and an exemplary set of balanced scan chains in accordance with an embodiment of the present invention.

Referring to FIG. 1, three scan chains are shown that are unbalanced in the top half of FIG. 1 (i.e., the three scan chains comprise significantly different numbers of flipflops). Scan chain 1 has 5000 flip-flops, scan chain 2 has 3000 flip-flops, and scan chain 3 has 1000 flip-flops, making for a total of 9000 flip-flops.

Ideally, the scan chains should be balanced as shown in the bottom half of FIG. 1 in accordance with an embodiment of the present invention. Each scan chain comprises 3000 flip-flops in the balanced configuration of the example of FIG. 1. In an embodiment of the present invention, each balanced scan chain is made up of linked sub-chains each comprising 1000 flip-flops. Therefore each scan chain (hereafter known as a global scan chain) comprises three sub-chains in the example of FIG. 1.

It is not necessary that each global scan chain be exactly balanced with every other global scan chain. In other words, each global scan chain does not need to have the exact same number of flip-flops. In an embodiment of the present invention, the global scan chains are balanced such that each global scan chain contains substantially the same number of flip-flops. For example, all of the global scan chains may be within 10 flip-flops of each other. Also, each sub-chain does not need to have the exact same number of flip-flops. However, in an embodiment of the present invention, each sub-chain is not allowed to exceed a certain number of flip-flops. For example, each sub-chain may be limited to a maximum of 1000 flip-flops.

Figure 2:
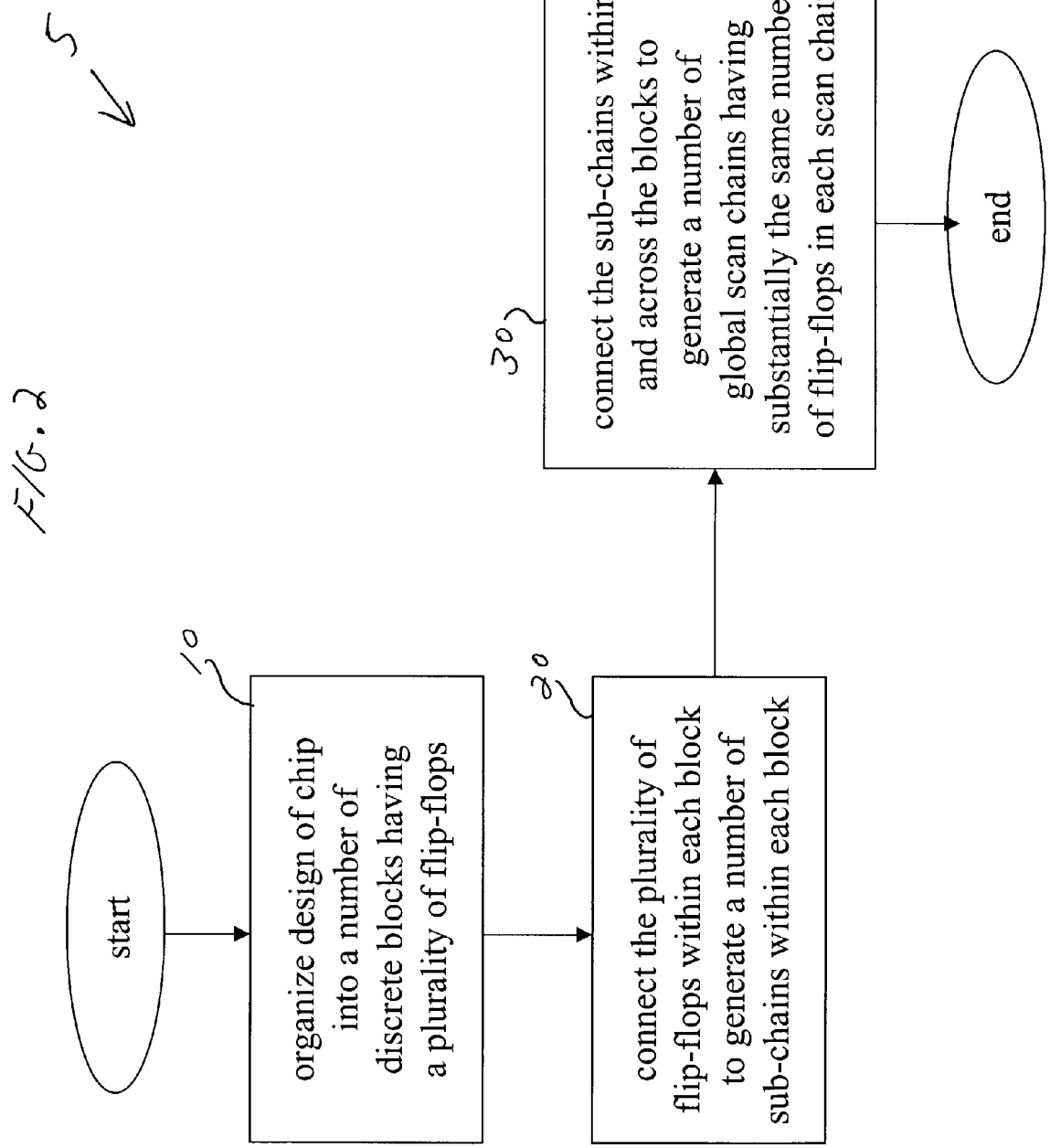
FIG. 2 is a flowchart of a method to balance a plurality of flip-flops in a design of a digital integrated circuit chip across a number of global scan chains in accordance with an embodiment of the present invention.

Referring to FIG. 2, in step 10 of method 5, the design of the digital integrated circuit chip is organized into a number of discrete blocks each having a plurality of flip-flops. By organizing the design of the chip into discrete blocks, different design teams may each work on one block independently of the other design teams. Each design team understands the functionality for their block and the rules for how their block must interface to the rest of the chip.

Each block may be designed with any number of flip-flops deemed appropriate by the design team for that block. In step 20, each design team, as part of the design, generates a number of sub-chains of flip-flops by connecting outputs of flip-flops to test inputs of flip-flops. Forming a sub-chain comprises linking an output of each flip-flop within the sub-chain to a test input of a next flip-flop within the sub-chain.

However, the design team is also given the restriction that no sub-chain may exceed a certain predefined upper limit of flip-flops. Also, the design team is given the goal of trying to make the number of flip-flops in each sub-chain as close to the upper limit as possible. As a result, each discrete block of the design of the chip will come back from each design team each comprising a plurality of sub-chains of flip-flops having a similar number of flip-flops in each sub-chain. For example, 1000 flip-flops may be the defined upper limit according to an embodiment of the present invention.

Finally, the design team is restricted to make each sub-chain correspond to only one clock domain. A clock domain is defined as a set of flip-flops that may all be clocked by the same clock signal (i.e., scan clock).

Once all of the discrete blocks of the design of the chip are completed, the sub-chains for each block may be connected within and across the blocks to generate a number of global scan chains having substantially the same number of flip-flops in each global scan chain as shown in step 30 of method 5.

Figure 3:
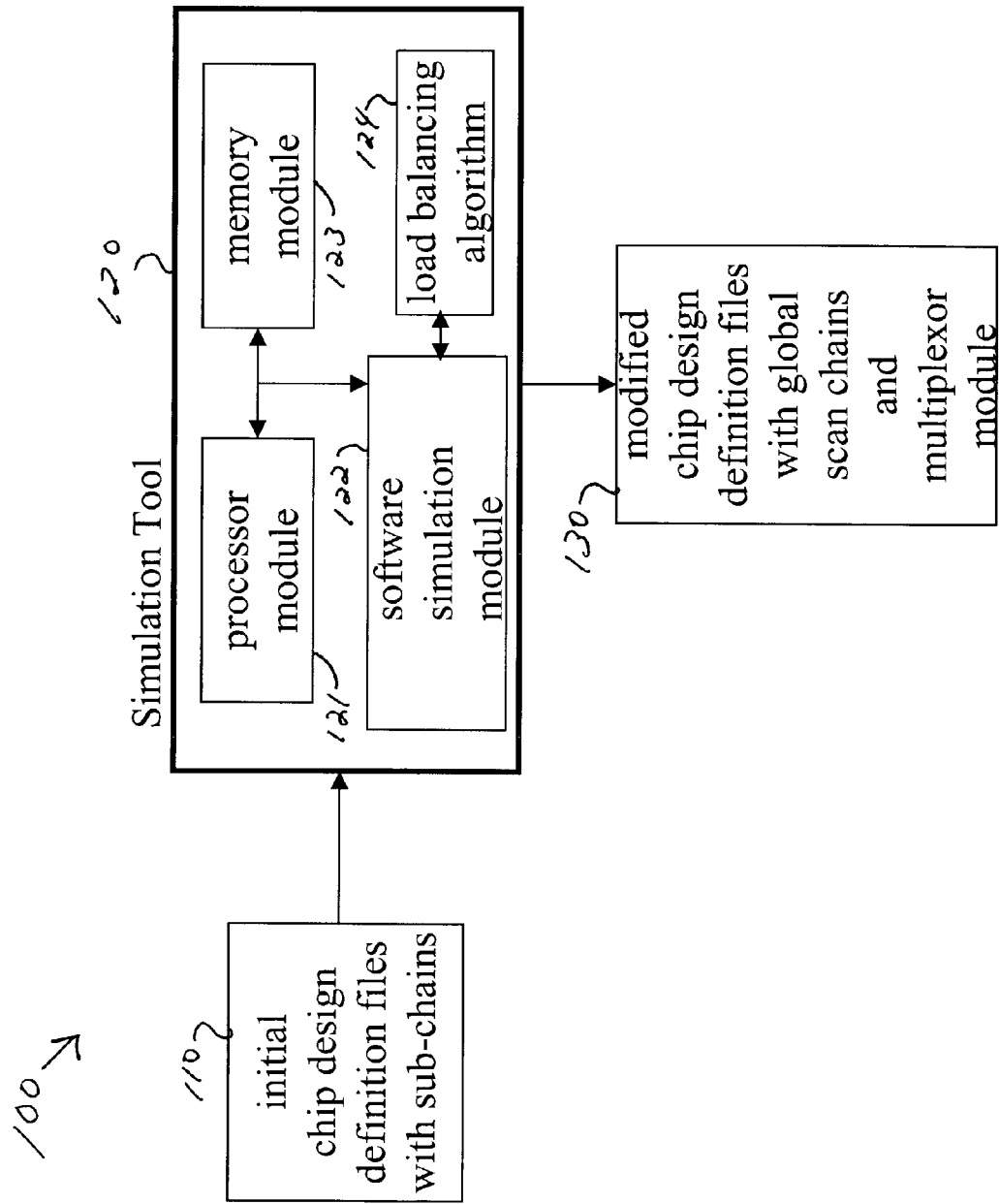
FIG. 3 is a schematic block diagram of a system to help balance a plurality of flip-flops across a number of global scan chains in a design of a digital integrated circuit chip in accordance with an embodiment of the present invention.

As the design of each discrete block is completed, the design of the chip is captured in a set of initial chip design definition files 110 (see FIG. 3). The set of initial chip design definition files 110 comprise the design of each discrete block each having a certain number of sub-chains. Each discrete block may have a different number of sub-chains but the vast majority of the sub-chains in each block comprise a similar number of flip-flops that do not exceed the predefined upper limit (e.g., 1000 flip-flops).

The system 100 of FIG. 3 may be used to connect or link the sub-chains of the discrete blocks in accordance with an embodiment of the present invention. A simulation tool 120 may be used to read in the set of initial chip design definition files. The simulation tool 120 comprises at least one processor module 121, at least one memory module 123, at least one software simulation module 122, and at least one load-balancing algorithm 124.

In accordance with an embodiment of the present invention, once the simulation tool 120 reads in the set of initial design definition files 110, the simulation tool 120 processes the files 110 in order to link the sub-chains of the discrete blocks of the design to form a number of global scan chains. Typically, a desired number of global scan chains may be 32, for example. The software simulation module 122, in conjunction with the load-balancing algorithm 124, is executed by processor module 121 to generate the desired number of global scan chains.

The load balancing algorithm 124 and software simulation module 122 attempt to partition approximately the same number of sub-chains into each of the global scan chains by analyzing the sub-chains in each discrete block and the relative location and timing of the sub-chains within the design of the chip. The load-balancing algorithm 124 may be any traditional or commercially available algorithm that is adequate for the balancing task.

The simulation tool 120 generates, as part of the design of the chip, a multiplexer module 200 that links the sub-chains together (see FIG. 4) in accordance with an embodiment of the present invention. Any two sub-chains are linked together through the multiplexer module 200. In general, the output of the last flip-flop of a first sub-chain is connected to a test input of the first flip-flop of a second sub-chain. However, the multiplexer module also provides timing synchronization between any two sub-chains to be linked if the two sub-chains are from different clock domains and are clocked on a same clock edge type (i.e., rising or falling edge).

Once the load balancing is finished, the design simulation tool 120 outputs a set of modified chip design definition files 130 comprising global scan chains and a multiplexer module in accordance with an embodiment of the present invention.

Timing synchronization between any two sub-chains is accomplished by a lock-up latch 201 within the multiplexer module 200 (see FIG. 4) in accordance with an embodiment of the present invention. For example, referring to FIG. 4, a scan pattern scan_in[0] may be input to multiplexer module 200 at input i_scan_in[0]. The scan pattern is multiplexed through the module 200 and is output at o_block1_si[1] and is routed through sub-chain 1 {si_neg_clock1[1]. . . so_neg_clock1[1]} of Block 1. Sub-chain 1 of Block 1 has a clock domain of clock1 and is triggered on a negative clock edge, as indicated by the nomenclature for the sub-chain (i.e., {si_neg_clock1[1]. . . so_neg_clock1[1]}). Sub-chain 1 of Block 1 then links back to the multiplexer module 200 at i_block1_so[1] and is multiplexed through module 200 to output o_block0_si[0] which is routed to sub-chain 0 {si_pos_clock0[0]. . . so_pos_clock0[0]} of Block 0. As a result, sub-chain 1 of Block 1 is linked to sub-chain 0 of Block 0 through multiplexer module 200. Sub-chain 1 of Block 1 and sub-chain 0 of Block 0 are from different clock domains (i.e., clock1 and clock0) but are triggered on different clock edges. Sub-chain 1 of Block 1 is triggered on a negative clock edge and sub-chain 0 of Block 0 is triggered on a positive clock edge. Therefore, the multiplexer module 200 does not provide timing synchronization between the two sub-chains.

Figure 4:
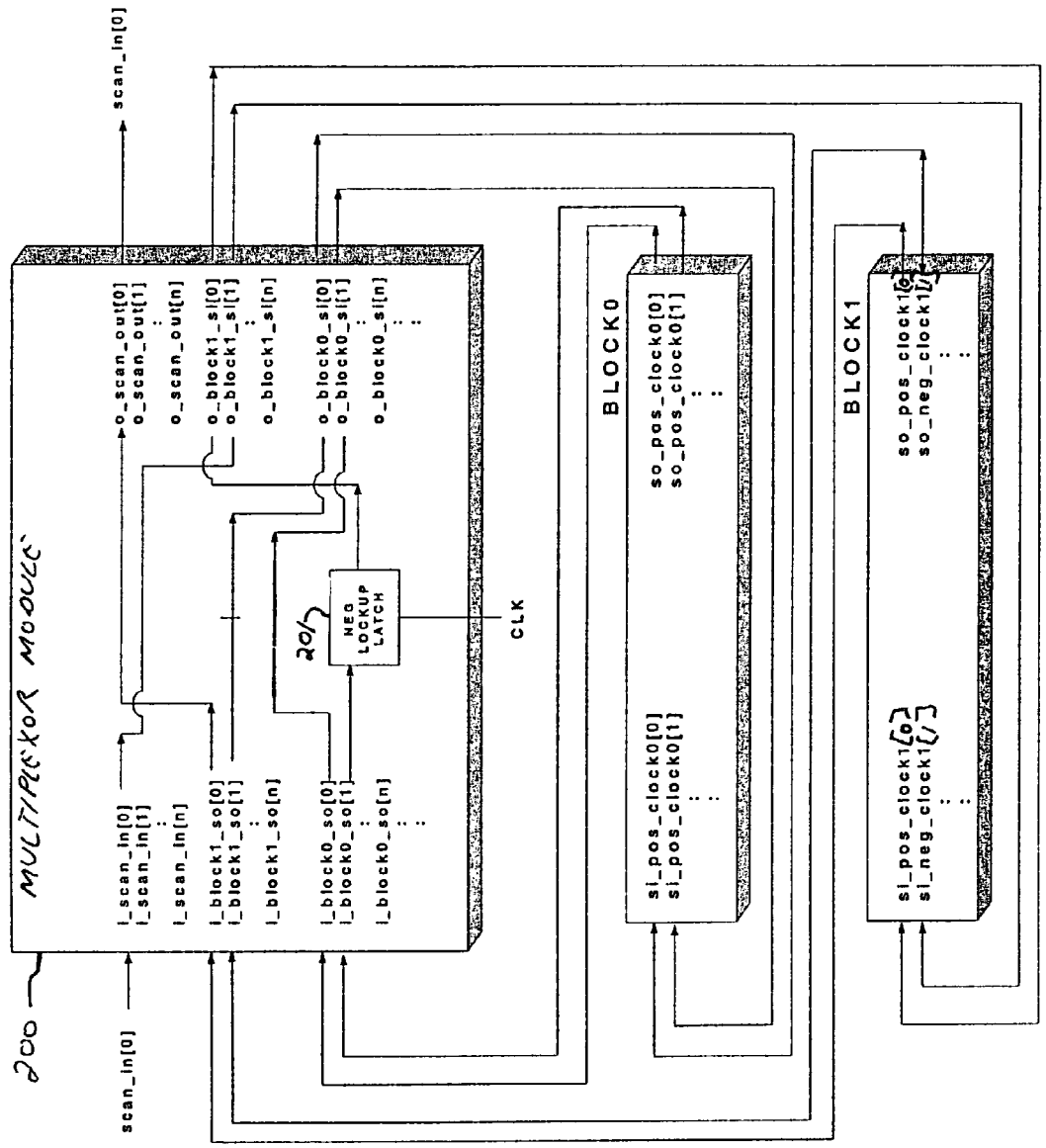
FIG. 4 is an exemplary illustration of how to link sub-chains of flip-flops through a multiplexer module in accordance with an embodiment of the present invention.

Continuing with the example of FIG. 4, sub-chain 0 of Block 0 is routed back to multiplexer module 200 at input i_block0_so[0] and is multiplexed through module 200 to output o_block0_si[1] and linked to sub-chain 1 {si_pos_clock0[1]. . . so_pos_clock0[1]} of Block 0. As a result, sub-chain 0 of Block 0 has been linked to sub-chain 1 of Block 0 where both sub-chains have the same clock domain and are both clocked on a positive edge. Therefore, timing synchronization is not required between sub-chain 0 of Block 0 and sub-chain 1 of Block 0.

Continuing, sub-chain 1 of Block 0 is routed back to multiplexer module 200 to input i_block0_so[1] and is multiplexed through lock-up latch 201 to output o_block1_si[0] and linked back to sub-chain 0 {si_pos_clock1[0]. . . so_pos_clock1[0]} of Block 1. Since, sub-chain 1 of Block 0 and sub-chain 0 of Block 1 have two different clock domains and are both clocked on the same edge type (i.e., positive edge in the example), then timing synchronization is required between the two sub-chains and is provided by lock-up latch 201 in multiplexer module 200. The timing synchronization provided by the lock-up latch ensures that the data flow through the linked sub-chains is not corrupted due to timing differences between the two sub-chains.

Finally, sub-chain 0 of Block 1 is routed back to multiplexer module 200 at input i_block1_so[0] and is multiplexed through to output o_scan_out[0]. As a result, a global scan chain comprising four sub-chains has been formed and may be clocked by a single scan clock signal during scan testing. It may be seen from the example of FIG. 4 that sub-chains may be linked within a block and across (or between) blocks to form a global scan chain. If, for example, each of the four sub-chains comprise 1000 flip-flops, then the resultant global scan chain comprises 4000 flip-flops.

Figure 5:
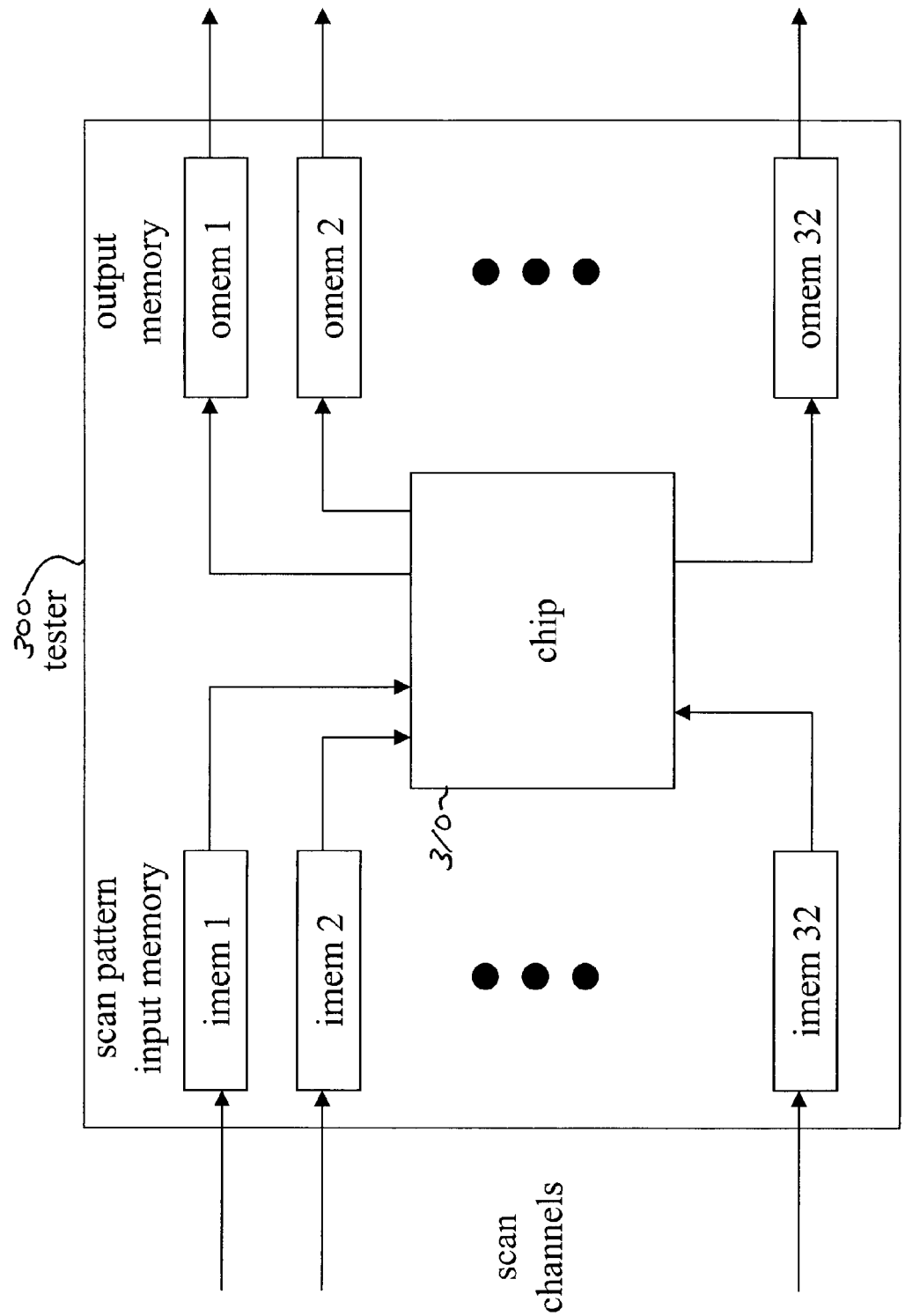
FIG. 5 is a schematic block diagram of a test for scan testing a fabricated chip having a set of balanced global scan chains in accordance with an embodiment of the present invention.

Referring to FIG. 5, once the design of a chip is complete with all of the global scan chains defined and balanced, a real chip 310 (i.e. hardware chip) may be fabricated, using the modified chip design definition files 130, and then scan tested on a tester 300. The number of global scan chains formed corresponds to the number of scan channels of the tester 300.

As an example, during scan testing, 32 scan channels of scan patterns may be shifted into input memory (imem 1 to imem 32) of the tester 300. Each of the scan channels of scan pattern data may be clocked through the global scan chains of the chip 310 and shifted out of the chip 310 into output memory (omem 1 to omem 32) within the tester 300. Each global scan chain is clocked using a different scan clock provided by the tester 300. The scan pattern data in the output memory of the tester may be compared to expected results to determine if the chip 310 is defective or not.

Since the global scan chains of the chip are balanced, the testing of the chip is very efficient. The length of the load_unload phase of the global scan chains is about the same for all global scan chains.

In summary, aspects of the present invention provide for balancing a plurality of flip-flops across a number of global scan chains in a design of a digital integrated circuit chip to facilitate efficient scan testing of the chip.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

What is claimed is:

1. A method to balance a plurality of flip-flops across a number of global scan chains in a design of a digital integrated circuit chip, said method comprising:
   organizing said design of said chip into a plurality of discrete blocks, wherein each of said discrete blocks comprises a plurality of flip-flops;
   connecting, within each of said discrete blocks, said plurality of flip-flops to generate a number of sub-chains of said flip-flops within each of said discrete blocks, wherein respective lengths of said sub-chains within all of said discrete blocks are generally similar; and
   serially connecting said sub-chains, within and across said discrete blocks, to generate said number of global scan chains, and wherein a resultant number of flip-flops in each of said global scan chains is substantially the same.

2. The method of claim 1 wherein said connecting said sub-chains within said design of said chip is performed by a multiplexer module as part of said design of said chip.

3. The method of claim 1 wherein each of said sub-chains corresponds to a single clock domain.

4. The method of claim 1 wherein each of said sub-chains comprises a number of flip-flops no greater than a predetermined limit.

5. The method of claim 1 wherein said connecting said sub-chains comprises providing timing synchronization between any two of said sub-chains to be connected if said any two of said sub-chains to be connected are from different clock domains and are clocked on a same clock edge type.

6. The method of claim 5 wherein said timing synchronization is implemented with a lock-up latch between said any two of said sub-chains to be connected.

7. The method of claim 1 wherein a load-balancing algorithm is used in generating each of said global scan chains having said substantially the same resultant number of flip-flops.

8. The method of claim 1 wherein said connecting, to generate any sub-chain of said number of sub-chains, comprises linking an output of each flip-flop within said any sub-chain to an input of a next flip-flop within said any sub-chain.

9. The method of claim 2 wherein said multiplexer module provides timing synchronization between any two of said sub-chains to be connected if said any two of said sub-chains to be connected are from different clock domains and are clocked on a same clock edge type.

10. The method of claim 9 wherein said timing synchronization between said any two of said sub-chains to be connected is implemented with a lock-up latch within said multiplexer module.

11. A system, used in a simulation of a design of a digital integrated circuit chip, to generate a number of global scan chains within said design of said chip, said system comprising:
   a design simulation tool;
   a set of initial chip design definition files organized as discrete blocks with each discrete block comprising sub-chains of flip-flops, wherein respective lengths of said sub-chains are generally similar within all of said discrete blocks, and wherein said set of initial chip design definition files is input into said simulation tool; and a set of modified chip design definition files generated by said simulation tool by processing said set of initial chip design definition files, and wherein said set of modified chip design definition files comprises said number of global scan chains funned by linking said sub-chains of flipflops within and across said discrete blocks.

12. The system of claim 11 wherein said design simulation tool comprises:
   at least one processor module;
   at least one memory module;
   at least one software simulation module residing in said at least one memory module and executed by said at least one processor module; and
   at least one load balancing algorithm residing in said at least one memory module and executed by said at least one processor module in conjunction with said at least one software simulation module.

13. The system of claim 11 wherein said linking said sub-chains of flip-flops within said chip design is accomplished by a multiplexer module generated by said design simulation tool as part of said set of modified chip design definition files.

14. The system of claim 11 wherein each of said sub-chains corresponds to a single clock domain.

15. The system of claim 11 wherein each of said sub-chains comprises a number of said flip-flops no greater than a predetermined limit.

16. The system of claim 13 wherein said multiplexer module provides timing synchronization between any two of said sub-chains to be linked if said any two of said sub-chains to be linked are from different clock domains and are clocked on a same clock edge type.

17. The system of claim 16 wherein said timing synchronization is implemented within said multiplexer module with a lock-up latch between said any two of said sub-chains to be linked.

18. The system of claim 12 wherein said load balancing algorithm is used in generating each of said global scan chains to ensure that each of said global scan chains comprises substantially the same resultant number of flip-flops.

19. The system of claim 11 wherein said flip-flops within any sub-chain of said sub-chains are linked by connecting an output of each flip-flop within said any sub-chain to an input of a next flip-flop within said any sub-chain.

20. The system of claim 13 wherein said multiplexer module links any two sub-chains of said global scan chains by connecting an output of a last flip-flop within a first sub-chain of said any two sub-chains to an input of a first flip-flop within a second sub-chain of said any two sub-chains.

21. A method for forming a plurality of substantially balanced global scan chains in a modular integrated circuit design, the method comprising:
   organizing the integrated circuit design into a plurality of discrete blocks, wherein each of the discrete blocks comprises a plurality of scan chain elements;
   generating one or more scan sub-chains in each of the discrete blocks, wherein each of the scan sub-chains comprises a plurality of the scan chain elements communicatively coupled, and wherein respective lengths of the scan sub-chains are generally similar within all of the discrete blocks; and generating the substantially balanced global scan chains, each of which comprises a plurality of the scan sub-chains serially and communicatively coupled, wherein at least one of the substantially balanced global scan chains comprises one of the scan sub-chains from a first of the discrete blocks serially and communicatively coupled to one of the scan sub-chains from a second of the discrete blocks.

22. The method of claim 21, wherein at least one of the generated global scan chains comprises a multiplexer communicatively coupled to an output of one of the scan sub-chains from a first of the discrete blocks and an input of one of the scan sub-chains from a second of the discrete blocks.

23. The method of claim 21, wherein generating the substantially balanced global scan chains comprises generating a multiplexer module through which at least a portion of the scan sub-chains from a plurality of the substantially balanced global scan chains are communicatively coupled.

24. The method of claim 21, wherein each of the scan sub-chains in a global scan chain correspond to a single clock domain.

25. The method of claim 21, wherein generating one or more scan sub-chains in each of the discrete blocks comprises limiting the length of the generated scan sub-chains to a predetermined limit.

26. The method of claim 21, wherein generating the substantially balanced global scan chains comprises providing timing synchronization in at least one of the global scan chains if any two of the scan sub-chains in the at least one of the global scan chains to be coupled are from different clock domains and are clocked on a same clock edge type.

27. The method of claim 21, wherein at least one of the generated substantially balanced global scan chains comprises a timing synchronization device communicatively coupled to an output of a first of the scan sub-chains and an input of a second of the scan sub-chains.

28. The method of claim 21, wherein at least one of the generated substantially balanced global scan chains comprises a lock-up latch communicatively coupled to an output of a first of the scan sub-chains and an input of a second of the scan sub-chains.

29. The method of claim 21, wherein at least one of the generated substantially balanced global scan chains comprises a multiplexer module communicatively coupled between an output of a first of the scan sub-chains and an input of a second of the scan sub-chains, the multiplexer module comprising a lock-up latch communicatively coupled to an output of the first of the scan sub-chains and an input of the second of the scan sub-chains.

30. The method of claim 21, wherein generating the substantially balanced global scan chains comprises utilizing a processor executing processing instructions to generate the substantially balanced global scan chains.

31. A system for generating a plurality of global scan chains in an integrated circuit design, the system comprising:
   first computer memory comprising information of an integrated circuit design sub-divided into discrete blocks, each of the discrete blocks comprising one or more scan sub-chains, each scan sub-chain comprising a plurality of serially and communicatively coupled scan chain elements, wherein respective lengths of the scan sub-chains are generally similar within all of the discrete blocks;
   a processor communicatively coupled, to the first computer memory;

second computer memory coupled to the processor comprising executable instructions that, when executed, cause the processor to generate an output signal comprising information of a plurality of substantially balanced global scan chains, each of the substantially balanced global scan chains comprising a plurality of the scan sub-chains serially and communicatively coupled, at least one of the substantially balanced global scan chains comprising one of the scan sub-chains from a first of the discrete blocks serially and communicatively coupled to one of the scan sub-chains from a second of the discrete blocks; and third computer memory coupled to the processor that receives the output signal comprising information of a plurality of substantially balanced global scan chains from the processor and stores the information of a plurality of substantially balanced global scan chains.

32. The system of claim 31, wherein at least one of the generated substantially balanced global scan chains comprises a multiplexer communicatively coupled to an output of one of the scan sub-chains from a first of the discrete blocks and an input of one of the scan sub-chains from a second of the discrete blocks.

33. The system of claim 31, wherein generating an output signal comprising information of a plurality of substantially balanced global scan chains comprises generating information of a multiplexer module through which at least a portion of the scan sub-chains from a plurality of the substantially balanced global scan chains are communicatively coupled.

34. The system of claim 31, wherein each of the scan sub-chains in a substantially balanced global scan chain correspond to a single clock domain.

35. The system of claim 31, wherein the length of the scan sub-chains is less than a predetermined limit.

36. The system of claim 31, wherein generating an output signal comprising information of a plurality of substantially balanced global scan chains comprises generating information of one or more devices providing timing synchronization in at least one of the global scan chains if any two of the scan sub-chains in the at least one of the global scan chains to be coupled are from different clock domains and are clocked on a seine clock edge type.

37. The system of claim 31, wherein at least one of the generated substantially balanced global scan chains comprises a dining synchronization device communicatively coupled to an output of a first of the scan sub-chains and an input of a second of the scan sub-chains.

38. The system of claim 31, wherein at least one of the generated substantially balanced global scan chains comprises a lock-up latch communicatively coupled to an output of a first of the scan sub-chains and an input of a second of the scan sub-chains.

39. The system of claim 31, wherein at least one of the generated substantially balanced global scan chains further comprises a multiplexer module communicatively coupled to an output of a first of the scan sub-chains and an input of a second of the scan sub-chains, the multiplexer module comprising a lock-up latch communicatively coupled to an output of the first of the scan sub-chains and an input of the second of the scan sub-chains.

40. The system of claim 31, wherein information of the discrete blocks is contained in a plurality of corresponding computer data files.

* * * * *

UNITED STATES PATENT AND TRADEMARK OFFICE
CERTIFICATE OF CORRECTION

PATENT NO. : 7,032,202 B2
APPLICATION NO. : 10/299187
DATED : April 18, 2006
INVENTOR(S) : Amar Guettaf and Xiaodong Xie It is certified that error appears in the above-identified patent and that said Letters Patent is hereby corrected as shown below:

Claim 11, column 7, line 8, delete "funned" and substitute -- formed --.

Claim 11, column 7, line 9, delete "flipflops" and substitute -- flip-flops --.

Claim 36, column 10, line 8, delete "seine" and substitute -- same --.

Claim 37, column 10, line 11, delete "dining" and substitute -- timing --.

Signed and Sealed this

Twenty-fifth Day of July, 2006

JON W. DUDAS
*Director of the United States Patent and Trademark Office*